United States Patent

Kosmach

[11] Patent Number: 5,996,110
[45] Date of Patent: Nov. 30, 1999

[54] METHOD AND APPARATUS FOR DECODING A DATA PACKET

[75] Inventor: James Joseph Kosmach, Watauga, Tex.

[73] Assignee: Motorola, Inc., Schaumburg, Ill.

[21] Appl. No.: 08/767,547

[22] Filed: Dec. 16, 1996

[51] Int. Cl.⁶ .............................................. H03M 13/00
[52] U.S. Cl. ...................... 714/780; 714/793; 714/759
[58] Field of Search ............................ 371/37.01, 37.02, 371/37.06, 37.11, 37.8, 37.03, 37.12, 43.5, 43.6; 714/793, 759, 780

[56] References Cited

U.S. PATENT DOCUMENTS

| | | | |
|---|---|---|---|
| 4,322,848 | 3/1982 | Snyder, Jr. | 371/43 |
| 4,328,582 | 5/1982 | Battail et al. | 371/37 |
| 4,404,674 | 9/1983 | Rhodes | 371/43 |
| 5,010,554 | 4/1991 | Bechtel et al. | 371/37.8 |
| 5,606,569 | 2/1997 | MacDonald et al. | 371/37.7 |
| 5,608,397 | 3/1997 | Soljanin | 341/58 |
| 5,721,754 | 2/1998 | Chen | 375/227 |
| 5,742,620 | 4/1998 | Iwamura | 371/37.11 |

OTHER PUBLICATIONS

Richard E. Blahut, *Theory and Practice of Error Control Codes*, pp. 191–197 & 464–472, 1983, USA.

*Primary Examiner*—William Grant
*Assistant Examiner*—Victoria Robinson
*Attorney, Agent, or Firm*—R. Louis Breeden

[57] ABSTRACT

A method and apparatus decodes a data packet in a communication system utilizing an error correcting code. Channel symbols are received (302), and channel symbol reliability weights are determined (306) for each. A code word symbol is formed (308) from the channel symbols, and the channel symbol reliability weights are mapped (312) into a code word symbol reliability weight, which is set equal to the minimum channel symbol reliability weight mapped for the code word symbol. The method and apparatus continues (318) to similarly process additional channel symbols until the data packet is completely collected. Then, a predetermined number of code word symbols having the lowest code word symbol reliability weights in the data packet are marked (320) as erasures, after which the data packet is decoded (322) by utilizing a soft decision decoding technique.

15 Claims, 3 Drawing Sheets

METHOD AND APPARATUS FOR DECODING A DATA PACKET

RELATED APPLICATIONS

Application Ser. No. 08/646,805 filed May 21, 1996 by Sammartino et al., entitled "An Adaptive Reed-Solomon Decoder and Methods Thereof." Application Ser. No. 08/646,803 filed May 21, 1996 by Chen, entitled "A Signal Quality Detector And Methods Thereof."

FIELD OF THE INVENTION

This invention relates in general to communication systems, and more specifically to a method and apparatus for decoding a data packet in a receiver of a communication system utilizing an error correcting code.

BACKGROUND OF THE INVENTION

In a digital communication system a receiver can provide side information in addition to the demodulated data. The side information, if it represents a reliability measure of the decoded symbol, can be used in an error control decoder to increase the coding gain and reduce bit error rate (BER) in a radio frequency (RF) environment. Since the side information accompanies each demodulated channel symbol, it is often called the channel symbol reliability weight.

Depending upon the type of modulation and demodulation techniques being used, the side information can be generated in different ways. The way in which the side information is generated and applied to the error control process can have a substantial influence on its success in reducing BER.

Thus, what is needed is a method and apparatus that can generate and apply the side information for reducing BER. Preferably, the side information will be generated and applied in a manner that produces the greatest possible improvement in receiver performance.

SUMMARY OF THE INVENTION

An aspect of the present invention is a method for decoding a data packet in a receiver of a communication system utilizing an error correcting code. The method comprises the steps of receiving a plurality of channel symbols, and determining for the plurality of channel symbols a corresponding plurality of channel symbol reliability weights. The method further comprises the steps of forming a code word symbol from the plurality of channel symbols, and setting a code word symbol reliability weight equal to one of the plurality of channel symbol reliability weights representing a lowest reliability received in the plurality of channel symbols used to form the code word symbol. The method also includes the steps of repeating the receiving, determining, forming, and setting steps until the data packet is completely collected and includes a plurality of code word symbols, and marking as erasures a predetermined number of the plurality of code word symbols having lowest code word symbol reliability weights in the data packet. In addition, the method includes the step of decoding the data packet by utilizing a soft decision decoding technique.

Another aspect of the present invention is a processing system for decoding a data packet in a receiver of a communication system utilizing an error correcting code. The processing system comprises an input interface for receiving a plurality of channel symbols, and a processor coupled to the input interface for processing the plurality of channel symbols. The processing system also includes a memory element coupled to the processor for storing the plurality of channel symbols, along with software for programming the processing system. The processing system is programmed to determine for the plurality of channel symbols a corresponding plurality of channel symbol reliability weights, and to form a code word symbol from the plurality of channel symbols. The processing system is further programmed to set a code word symbol reliability weight equal to one of the plurality of channel symbol reliability weights representing a lowest reliability received in the plurality of channel symbols used to form the code word, and to continue to process additional pluralities of channel symbols in a similar manner until the data packet is completely collected and includes a plurality of code word symbols. In addition, the processing system is programmed to mark as erasures a predetermined number of the plurality of code word symbols having lowest code word symbol reliability weights in the data packet, and to decode the data packet by utilizing a soft decision decoding technique.

Another aspect of the present invention is a receiver for decoding a data packet in a communication system utilizing an error correcting code. The receiver comprises a receiver circuit for receiving a plurality of channel symbols, and a user interface for conveying decoded information to a user of the receiver. The receiver further comprises a processing system coupled to the receiver circuit for decoding the data packet and coupled to the user interface for supplying the decoded information thereto. The processing system comprises an input interface for receiving a plurality of channel symbols, and a processor coupled to the input interface for processing the plurality of channel symbols. The processing system also includes a memory element coupled to the processor for storing the plurality of channel symbols, along with software for programming the processing system. The processing system is programmed to determine for the plurality of channel symbols a corresponding plurality of channel symbol reliability weights, and to form a code word symbol from the plurality of channel symbols. The processing system is further programmed to set a code word symbol reliability weight equal to one of the plurality of channel symbol reliability weights representing a lowest reliability received in the plurality of channel symbols used to form the code word, and to continue to process additional pluralities of channel symbols in a similar manner until the data packet is completely collected and includes a plurality of code word symbols. In addition, the processing system is programmed to mark as erasures a predetermined number of the plurality of code word symbols having lowest code word symbol reliability weights in the data packet, and to decode the data packet by utilizing a soft decision decoding technique.

DETAILED DESCRIPTION OF THE DRAWINGS

Figure 1:
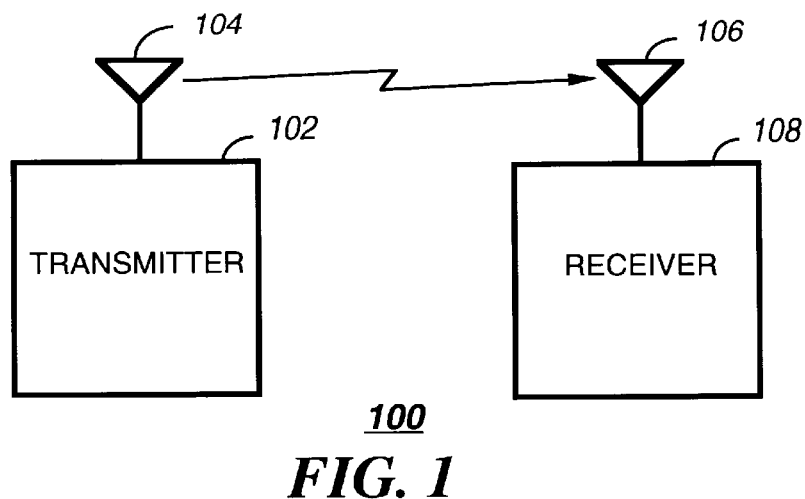
FIG. 1 is an electrical block diagram of a radio communication system in accordance with the present invention.

Referring to FIG. 1, an electrical block diagram depicts a radio communication system 100 in accordance with the present invention, comprising a transmitter 102 and a receiver 108. The transmitter 102 and the receiver 108 are coupled to antennas 104, 106 for communicating by radio signals. The transmitter 102 preferably is a conventional frequency shift keyed (FSK) transmitter and communicates using a well-known messaging system protocol, such as a protocol from Motorola's FLEX™ family of protocols, which uses Reed-Solomon encoding to facilitate error detection and correction. The receiver 108 preferably is similar to the RF-Audience! inbound base receiver manufactured by Motorola, Inc., modified in accordance with the present invention.

Figure 2:
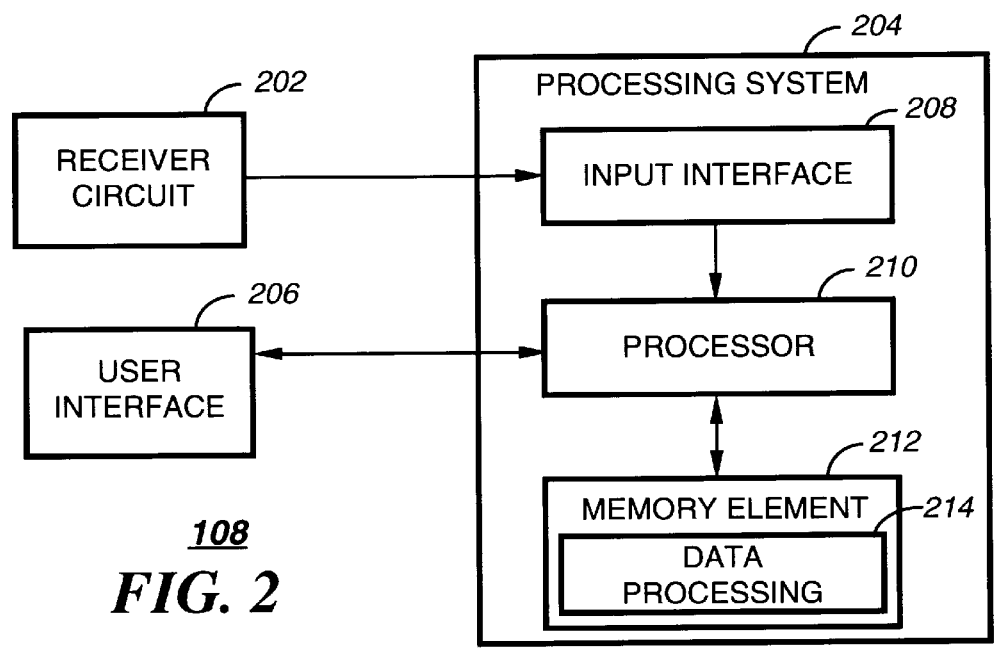
FIG. 2 is an electrical block diagram of a receiver in accordance with the present invention.

Referring to FIG. 2, an electrical block diagram depicts the receiver 108 for decoding a data packet in accordance with the present invention, comprising a conventional receiver circuit 202 for receiving a plurality of channel symbols transmitted by the transmitter 102. The receiver 108 further comprises a processing system 204 coupled to the receiver circuit 202 for decoding the data packet. The processing system 204 comprises a conventional input interface 208, e.g., a conventional analog-to-digital converter, coupled to the receiver circuit 202 for receiving the plurality of channel symbols from the receiver circuit 202. The processing system 204 further comprises a processor 210 coupled to the input interface 208 for processing the plurality of channel symbols, and a memory element 212 coupled to the processor 210 for storing the plurality of channel symbols, along with software for programming the processing system 204. The preferred form of the processing system 204 is substantially implemented within a conventional digital signal processor (DSP) executing software that may readily be written by one of ordinary skill in the art given the principles herein disclosed. In the alternative the processing system 204 could easily be adapted to and implemented as one or more integrated circuits, such as semi-custom integrated circuits. A user interface 206 is coupled to the processing system 204 for conveying decoded information derived from the channel symbols to a user of the receiver 108. The user interface 206 preferably comprises a conventional audible, visual, or tactile alert, e.g., a liquid crystal display, loudspeaker, or vibrator, and conventional control buttons for operating the receiver 108 using techniques well known in the art.

The memory element 212 includes data processing software 214 for programming the processing system 204 in accordance with the present invention. The data processing software 214 programs the processing system 204 to determine for the plurality of channel symbols a corresponding plurality of channel symbol reliability weights. This preferably is done by computing metrics for each received channel symbol by comparing a received waveform for the received channel symbol with possible transmitted waveforms corresponding to each possible symbol value, the metrics indicating degree of match between the received waveform and the possible transmitted waveforms. For example, a conventional frequency domain processing technique, e.g., a fast Fourier transform technique, for a 4-ary FSK receiver can generate four values indicative of the energy received during a symbol interval at each of four predetermined symbol frequencies. These four values serve as the metrics for the received symbol. The processing system 204 then computes the channel symbol reliability weight as a function of the metrics. Preferably, the processing system 204 examines the metrics to locate a first metric indicating a highest degree of match, i.e., the largest of the four values (which corresponds to the most likely received channel symbol), and a second metric indicating a second highest degree of match, i.e., the second largest value. The processing system 204 then calculates the channel symbol reliability weight as a function of the first and second metrics. Preferably, the calculation is a simple subtraction of the second largest value from the largest value, a large difference indicative of a high channel symbol reliability weight, and a small difference indicative of a low channel symbol reliability weight. It will be appreciated that, alternatively, the channel symbol reliability weight can be calculated in many other manners, e.g., by forming a ratio of the largest and second largest values, or by determining the difference of the squares of the largest and second largest values, or by comparing the largest value with the average of the other three values, to name a few alternatives. The data processing software 214 also programs the processing system 204 to form a code word symbol from the plurality of channel symbols. The number of bits defined for each code word symbol depends upon the specific error correcting code chosen. Thus, the code word symbol bit length is typically different from the channel symbol bit length.

For example, the channel symbols can be two-bit 4-ary symbols, and the code word symbols can be five-bit 32-ary symbols. For this reason, the processing system 204 is further programmed to map the plurality of channel symbol reliability weights into a code word symbol reliability weight. To do this the code word symbol reliability weight preferably is set equal to one of the plurality of channel symbol reliability weights representing a lowest reliability received in the plurality of channel symbols. For example, if bits from three channel symbols having weights $w_1$, $w_2$, and $w_3$ are used to form one code word symbol, then the code word symbol reliability weight $w_c$ is preferably calculated as $$w_c = \min(w_1, w_2, w_3), \text{ where } \min(\ ) \text{ means minimum of } (\ ).$$

The data processing software 214 also programs the processing system 204 to continue to process additional pluralities of channel symbols in a similar manner to that described herein above, until the data packet is completely collected, and to mark as erasures a predetermined number of code word symbols having the lowest code word symbol reliability weights in the data packet. In addition, the data processing software 214 programs the processing system 204 to then decode the data packet by utilizing a well-known soft decision decoding technique, such as the Generalized Minimum Distance Decoding technique, which utilizes multiple error and erasure decoders. As an error and erasure decoder can successfully decode twice as many erasures as compared to unmarked errors, the BER is advantageously reduced in accordance with the present invention.

Depending on how many channel symbol bits are required to form a code word symbol, the processing system 204 can be programmed to form the code word symbol from a portion of a channel symbol. This becomes necessary, for example, when the number of bits in the code word is not evenly divisible by the number of bits in the channel symbol.

Figure 3:
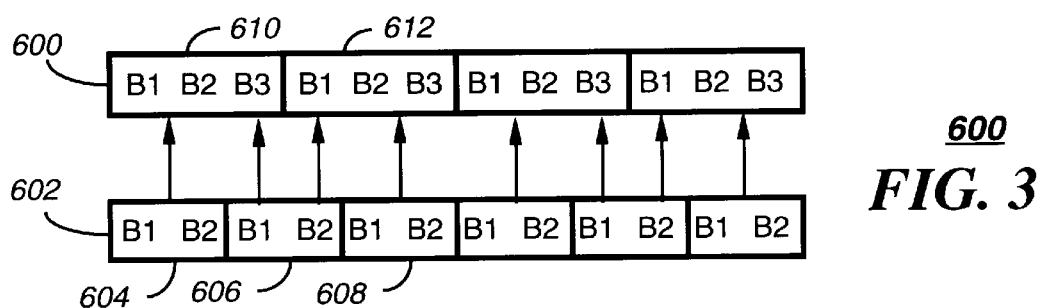
FIG. 3 is a bit mapping diagram in accordance with the present invention.

Referring to FIG. 3, a bit mapping diagram 600 depicts such a case. The top row 600 depicts four three-bit code word symbols. The bottom row 602 depicts six two-bit channel symbols. Note that both bits of the first channel symbol 604 map into the first code word symbol 610, while only the high order bit of the second channel symbol 606 maps into the first code word symbol 610. The low order bit of the second channel symbol 606 maps into the second code word symbol 612, as do both bits of the third channel symbol 608. For such cases, advantage can be taken when the receiver is constructed such that both the channel symbol and a next most likely received channel symbol are known. For example, consider a 4-ary discriminator-type FSK receiver in which the four possible transmitted channel symbols ranging from lowest to highest frequency are: 10, 11, 01, 00. If the receiver erroneously detects the 10 channel symbol as the "most likely" received symbol, then the "next most likely" symbol, i.e., the symbol 11 adjacent to the most likely symbol, has the highest probability of being the symbol actually transmitted. Thus, for this specific example, if the portion of the channel symbol which the processing system 204 is using to form the code word symbol is the high order portion of the channel symbol, that portion is not likely to be affected by an error, because its value is 1 for both the most likely and the next most likely symbols. On the other hand, if the portion of the channel symbol which the processing system 204 is using to form the code word symbol is the low order portion of the channel symbol, that portion is likely to be affected by an error, because its value is different for the most likely (10) and the next most likely (11) symbols. Thus, the processing system 204 preferably is further programmed to map a channel symbol reliability weight corresponding to the channel symbol into the code word reliability weight, when the next most likely received channel symbol would cause a change in the portion of the channel symbol, and to exclude the channel symbol reliability weight from the code word reliability weight, when the next most likely received channel symbol would cause no change in the portion of the channel symbol.

Figure 4:
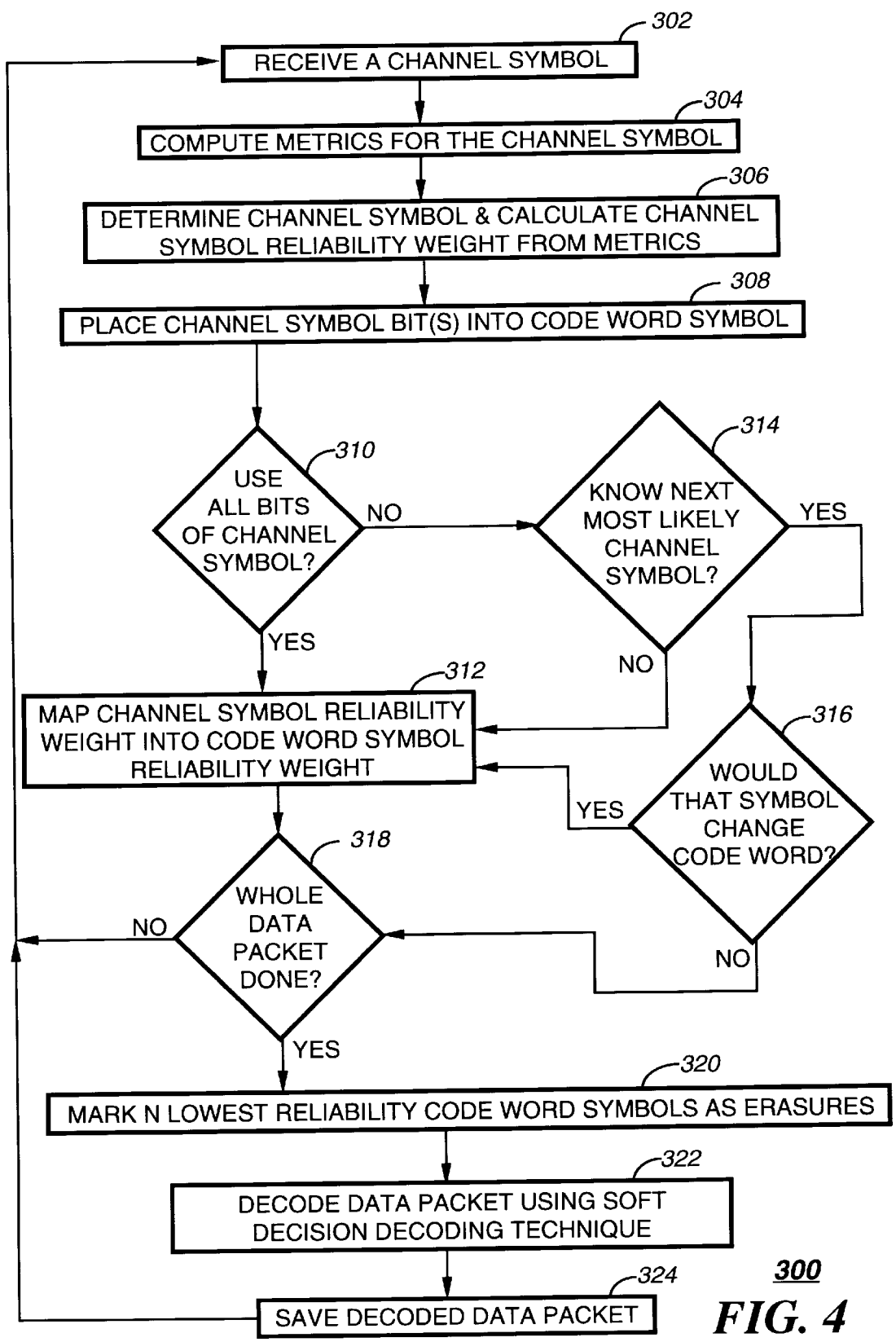
FIG. 4 is a flow chart depicting operation of the receiver in accordance with the present invention.

Referring to FIG. 4, a flow chart 300 depicts operation of the receiver 108 in accordance with the present invention. The flow chart begins with the processing system 204 receiving 302 a channel symbol from the receiver circuit 202. The processing system 204 then computes 304 metrics for the channel symbol, preferably by using well-known frequency domain techniques to determine the amount of energy received during the symbol interval at each of a set of possible symbol frequencies. The processing system 204 then determines 306 the most likely received channel symbol, preferably by selecting the channel symbol corresponding to a largest one of the metrics. The processing system 204 also calculates the channel symbol reliability weight from the metrics, e.g., by finding the difference between the largest metric and the second largest metric. The processing system 204 then places 308 the channel symbol bits (or bit, if only one bit is needed) into a next available location in the code word symbol. The processing system 204 then checks 310 whether it used all the bits of the channel symbol. If not, the processing system 204 checks 314 whether there exists a known next most likely channel symbol. If not, the processing system 204 maps 312 the channel symbol reliability weight into the code word symbol reliability weight by considering the channel symbol reliability weight in determining the minimum channel symbol reliability weight utilized to form the code word symbol, and then moves to step 318. If, on the other hand, the processing system 204 determines in step 314 that the next most likely channel symbol value is known, then the processing system 204 checks 316 whether that symbol value would change the codeword symbol. If so, the processing system 204 maps 312 the channel symbol reliability weight into the code word symbol reliability weight. If not, the processing system 204 excludes the channel symbol reliability weight from consideration in determining the minimum channel symbol reliability weight, and moves to step 318.

On the other hand, if in step 310 the processing system 204 determines that all bits of the channel symbol were used, then the flow moves directly to step 312 to map the channel symbol reliability weight into the code word symbol reliability weight, and then to step 318. At step 318 the processing system 204 checks whether the whole data packet has been processed. If not, the processing system 204 returns to step 302 to receive another channel symbol. If, on the other hand, the whole data packet is done, then the processing system 204 proceeds to step 320 to mark a predetermined number, e.g., two, four, six, and eight, of the of the least reliable code word symbols as erasures. Then the processing system 204 decodes 322 the data packet using a well-known soft decision decoding technique, such as the Generalized Minimum Distance Decoding technique. Next, the processing system 204 saves 324 the decoded data packet in the memory element 212 for conveying information derived therefrom to the user. The processing system 204 then returns to step 302 to receive a next channel symbol.

Figure 5:
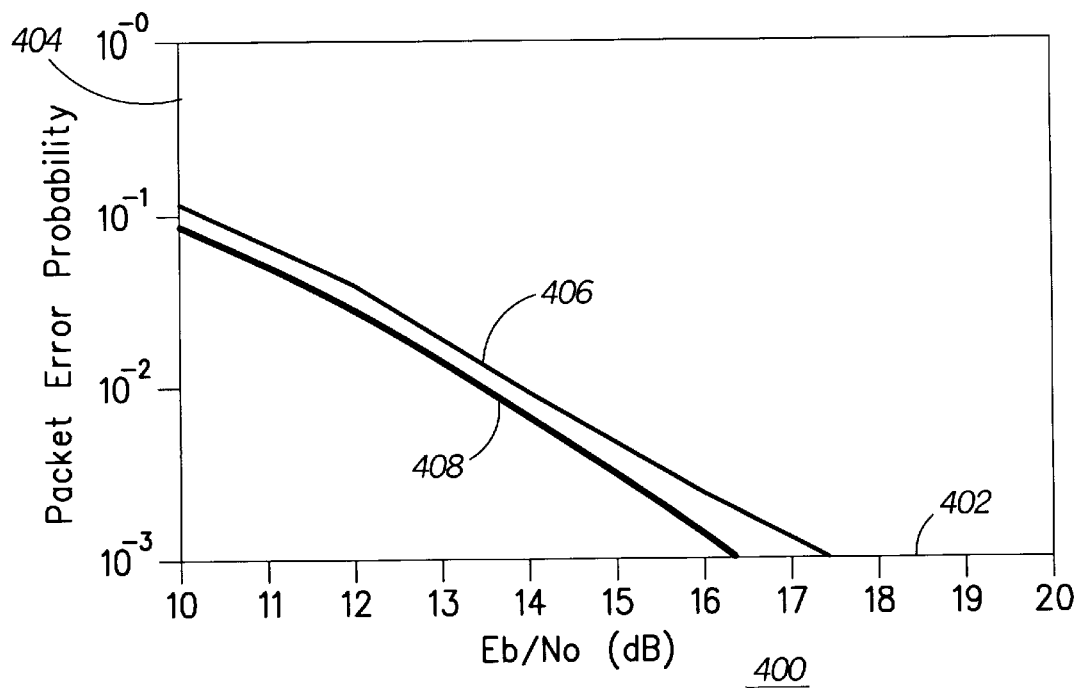
FIG. 5 is an error performance diagram depicting an improvement resulting from a first aspect in accordance with the present invention.

Referring to FIG. 5, an error performance diagram 400 depicts a typical improvement resulting from a first feature in accordance with the present invention. The first feature is the aforementioned determination of the channel symbol reliability weight from the difference of the highest and second highest metrics computed for the received symbol. In the diagram 400, the horizontal scale 402 depicts the ratio of energy per bit to noise spectral density (Eb/No) expressed in decibels (dB). The vertical scale 404 depicts the packet error probability. The top curve 406 plots performance when signal-to-noise ratio is used as the channel symbol reliability weight, as has been done in some prior art receivers. The bottom curve 408 plots performance when the difference of the highest and second highest metrics is used as the channel symbol reliability weight in accordance with the present invention. Advantageously, the bottom curve 408 indicates a performance improvement of approximately 0.5 dB over the prior art technique.

Figure 6:
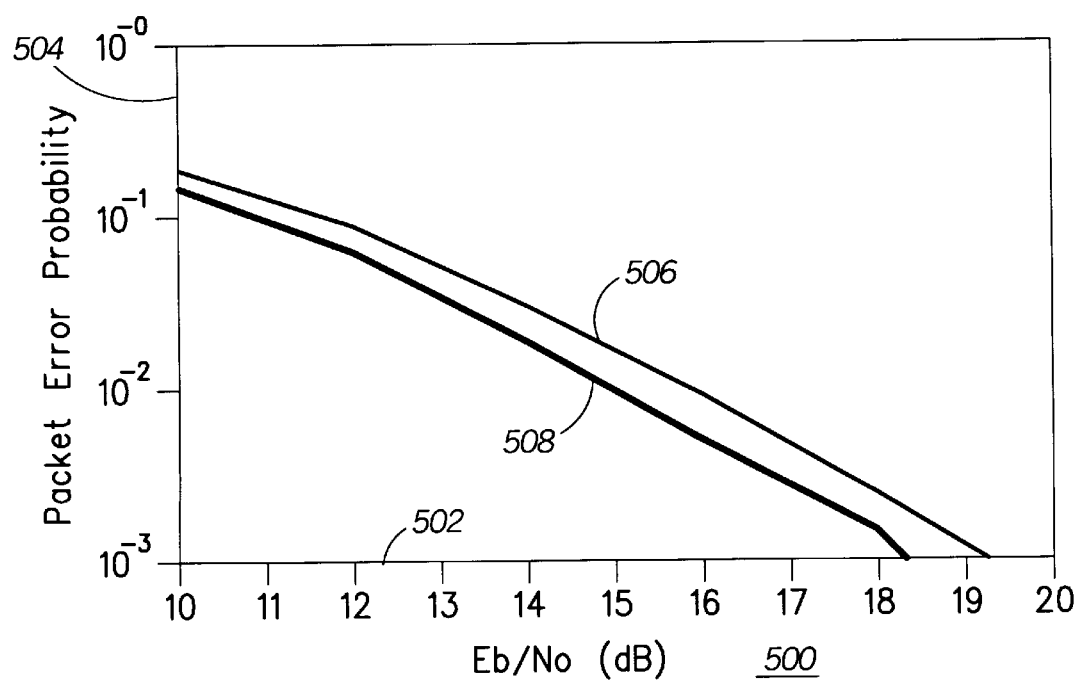
FIG. 6 is an error performance diagram depicting an improvement resulting from a second aspect in accordance with the present invention.

Referring to FIG. 6, an error performance diagram 500 depicts a typical improvement resulting from a second feature in accordance with the present invention. The second feature is the aforementioned use of the minimum channel symbol reliability weight as the code word symbol reliability weight (instead of the prior art technique of using a calculated weighted mean of the channel symbol weights as the code word symbol reliability weight). The horizontal and vertical scales 502, 504 are similar to the corresponding scales 402, 404 of the diagram 400. The top curve 506 plots performance when the calculated weighted mean of the channel symbol weights is used as the code word symbol reliability weight. The bottom curve 508 plots performance when the minimum channel symbol reliability weight is used as the code word symbol reliability weight. Advantageously, the bottom curve 508 indicates a performance improvement of almost 1 dB over the prior art technique. As the first and second features are uncorrelated, the use of both features in the receiver 108 should produce a total performance improvement of about 1.5 dB.

Thus, it should be clear by now that the present invention provides a method and apparatus that generate and apply receiver side information for reducing BER. Advantageously, the receiver side information is generated and applied in a manner that produces a significant improvement in receiver performance compared to prior art techniques.

While the foregoing has disclosed by way of example an embodiment in accordance with the present invention, it will be appreciated that many alternative embodiments in accordance with the present invention may occur to one of ordinary skill in the art, given the teachings of this disclosure. Consequently, the scope of the invention is delimited only in accordance with the following claims.

What is claimed is:

1. A method for decoding a data packet in a receiver of a communication system utilizing an error correcting code, the method comprising the steps of:

receiving a plurality of channel symbols;

determining for the plurality of channel symbols a corresponding plurality of channel symbol reliability weights;

forming a code word symbol from the plurality of channel symbols;

setting a code word symbol reliability weight equal to one of the plurality of channel symbol reliability weights representing a lowest reliability received in the plurality of channel symbols used to form the code word symbol;

repeating the receiving, determining, forming, and setting steps until the data packet is completely collected and includes a plurality of code word symbols;

marking as erasures a predetermined number of the plurality of code word symbols having lowest code word symbol reliability weights in the data packet; and decoding the data packet by utilizing a soft decision decoding technique.

2. The method of claim 1, wherein the determining step comprises for each received channel symbol the steps of:

computing metrics by comparing a received waveform for the received channel symbol with possible transmitted waveforms corresponding to each possible symbol value, the metrics indicating degree of match between the received waveform and the possible transmitted waveforms; and calculating a channel symbol reliability weight as a function of the metrics.

3. The method of claim 1, wherein the determining step comprises for each received channel symbol the steps of:

computing metrics by comparing a received waveform for the received channel symbol with possible transmitted waveforms corresponding to each possible symbol value, the metrics indicating degree of match between the received waveform and the possible transmitted waveforms;

locating a first metric indicating a highest degree of match and a second metric indicating a second highest degree of match; and calculating a channel symbol reliability weight as a function of the first and second metrics.

4. The method of claim 1, wherein the forming step comprises the step of forming the code word symbol by utilizing a portion of a channel symbol, and wherein the receiver is constructed such that both the channel symbol and a next most likely received channel symbol are known, and wherein the setting step comprises the steps of:

including a channel symbol reliability weight corresponding to the channel symbol in the code word symbol reliability weight, when the next most likely received channel symbol would cause a change in the portion of the channel symbol utilized, and excluding the channel symbol reliability weight from the code word symbol reliability weight, when the next most likely received channel symbol would cause no change in the portion of the channel symbol utilized.

5. The method of claim 1, wherein the error correcting code is a Reed-Solomon code, and wherein the decoding step comprises utilization of a Generalized Minimum Distance Decoding technique.

6. A processing system for decoding a data packet in a receiver of a communication system utilizing an error correcting code, the processing system comprising:

an input interface for receiving a plurality of channel symbols;

a processor coupled to the input interface for processing the plurality of channel symbols; and a memory element coupled to the processor for storing the plurality of channel symbols, along with software for programming the processing system, wherein the processing system is programmed to:

determine for the plurality of channel symbols a corresponding plurality of channel symbol reliability weights;

form a code word symbol from the plurality of channel symbols;

set a code word symbol reliability weight equal to one of the plurality of channel symbol reliability weights representing a lowest reliability received in the plurality of channel symbols used to form the code word;

continue to process additional pluralities of channel symbols in a similar manner until the data packet is completely collected and includes a plurality of code word symbols;

mark as erasures a predetermined number of the plurality of code word symbols having lowest code word symbol reliability weights in the data packet; and decode the data packet by utilizing a soft decision decoding technique.

7. The processing system of claim 6, further programmed to:

compute metrics for each received channel symbol by comparing a received waveform for the received channel symbol with possible transmitted waveforms corresponding to each possible symbol value, the metrics indicating degree of match between the received waveform and the possible transmitted waveforms; and calculate a channel symbol reliability weight as a function of the metrics.

8. The processing system of claim 6, further programmed to:

compute metrics for each received channel symbol by comparing a received waveform for the received channel symbol with possible transmitted waveforms corresponding to each possible symbol value, the metrics indicating degree of match between the received waveform and the possible transmitted waveforms;

locate a first metric indicating a highest degree of match and a second metric indicating a second highest degree of match; and calculate a channel symbol reliability weight as a function of the first and second metrics.

9. The processing system of claim 6, further programmed to:
- form the code word symbol by utilizing a portion of a channel symbol, the receiver being constructed such that both the channel symbol and a next most likely received channel symbol are known, and
- include a channel symbol reliability weight corresponding to the channel symbol in the code word symbol reliability weight, when the next most likely received channel symbol would cause a change in the portion of the channel symbol utilized, and
- exclude the channel symbol reliability weight from the code word symbol reliability weight, when the next most likely received channel symbol would cause no change in the portion of the channel symbol utilized.

10. The processing system of claim 6,
wherein the error correcting code is a Reed-Solomon code, and
wherein the processing system is further programmed to utilize a Generalized Minimum Distance Decoding technique to decode the data packet.

11. A receiver for decoding a data packet in a communication system utilizing an error correcting code, the receiver comprising:
- a receiver circuit for receiving a plurality of channel symbols;
- a user interface for conveying decoded information to a user of the receiver; and
- a processing system coupled to the receiver circuit for decoding the data packet and coupled to the user interface for supplying the decoded information thereto, the processing system comprising;
  - an input interface coupled to the receiver circuit for receiving the plurality of channel symbols therefrom;
  - a processor coupled to the input interface for processing the plurality of channel symbols; and
  - a memory element coupled to the processor for storing the plurality of channel symbols, along with software for programming the processing system,
- wherein the processing system is programmed to:
  - determine for the plurality of channel symbols a corresponding plurality of channel symbol reliability weights;
  - form a code word symbol from the plurality of channel symbols;
  - set a code word symbol reliability weight equal to one of the plurality of channel symbol reliability weights representing a lowest reliability received in the plurality of channel symbols used to form the code word;
  - continue to process additional pluralities of channel symbols in a similar manner until the data packet is completely collected and includes a plurality of code word symbols;
  - mark as erasures a predetermined number of the plurality of code word symbols having lowest code word symbol reliability weights in the data packet; and
  - decode the data packet by utilizing a soft decision decoding technique.

12. The receiver of claim 11, wherein the processing system is further programmed to:
- compute metrics for each received channel symbol by comparing a received waveform for the received channel symbol with possible transmitted waveforms corresponding to each possible symbol value, the metrics indicating degree of match between the received waveform and the possible transmitted waveforms; and
- calculate a channel symbol reliability weight as a function of the metrics.

13. The receiver of claim 11, wherein the processing system is further programmed to:
- compute metrics for each received channel symbol by comparing a received waveform for the received channel symbol with possible transmitted waveforms corresponding to each possible symbol value, the metrics indicating degree of match between the received waveform and the possible transmitted waveforms;
- locate a first metric indicating a highest degree of match and a second metric indicating a second highest degree of match; and
- calculate a channel symbol reliability weight as a function of the first and second metrics.

14. The receiver of claim 11,
wherein the error correcting code is a Reed-Solomon code, and
wherein the processing system is further programmed to utilize a Generalized Minimum Distance Decoding technique to decode the data packet.

15. The receiver of claim 11, wherein the processing system is further programmed to:
- form the code word symbol by utilizing a portion of a channel symbol, the receiver being constructed such that both the channel symbol and a next most likely received channel symbol are known, and
- include a channel symbol reliability weight corresponding to the channel symbol in the code word symbol reliability weight, when the next most likely received channel symbol would cause a change in the portion of the channel symbol utilized, and
- exclude the channel symbol reliability weight from the code word symbol reliability weight, when the next most likely received channel symbol would cause no change in the portion of the channel symbol utilized.

* * * * *